(12) United States Patent
Saito et al.

(10) Patent No.: US 7,558,501 B2
(45) Date of Patent: Jul. 7, 2009

(54) IMAGE FORMING APPARATUS AND POWER SUPPLY

(75) Inventors: Tohru Saito, Mishima (JP); Masahiro Suzuki, Numazu (JP); Osamu Nagasaki, Numazu (JP); Koichi Suzuki, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 404 days.

(21) Appl. No.: 11/333,484

(22) Filed: Jan. 17, 2006

(65) Prior Publication Data
US 2007/0025753 A1 Feb. 1, 2007

(30) Foreign Application Priority Data
Aug. 1, 2005 (JP) ............................. 2005-222761

(51) Int. Cl.
G03G 15/00 (2006.01)
G03G 15/16 (2006.01)

(52) U.S. Cl. ............................... 399/88; 399/44; 399/66

(58) Field of Classification Search ................... 399/44, 399/66, 88
See application file for complete search history.

(56) References Cited

U.S. PATENT DOCUMENTS 5,585,906 A * 12/1996 Takahashi et al. ........... 399/296
7,376,366 B2 * 5/2008 Deguchi ...................... 399/66
2004/0165901 A1 * 8/2004 Nakata et al. ................. 399/66

FOREIGN PATENT DOCUMENTS

| JP | 11-206113 A | 7/1999 |
|----|----|----|
| JP | 11-252905 A | 9/1999 |
| JP | 2003-209972 A | 7/2003 |
| JP | 2005-198462 A | 7/2005 |
| KR | 2000-0056600 | 9/2000 |

* cited by examiner

*Primary Examiner*—David M Gray
*Assistant Examiner*—Joseph S Wong
(74) *Attorney, Agent, or Firm*—Canon U.S.A., Inc. I.P. Division

(57) ABSTRACT

An image forming apparatus includes a high-voltage power supply having a piezoelectric transformer. The power supply includes a positive output voltage generation circuit and a negative output voltage generation circuit. Each of the positive output voltage generation circuit and the negative output voltage generation circuit includes a piezoelectric transformer, a piezoelectric transformer driving circuit, an output voltage detection circuit, and a drive control circuit for outputting a control signal for controlling the piezoelectric transformer driving circuit using a signal from the output voltage detection circuit and an output voltage setting signal for setting an output voltage. The positive output voltage generation circuit and the negative output voltage generation circuit are simultaneously turned on when the output polarity of the high-voltage power supply with a piezoelectric transformer is switched.

5 Claims, 7 Drawing Sheets

IMAGE FORMING APPARATUS AND POWER SUPPLY

BACKGROUND OF THE INVENTION

1. Field of the Invention

The present invention relates to a power supply having a switchable polarity for use in an electrophotographic image forming apparatus. The present invention also relates to an image forming apparatus using such a power supply.

2. Description of the Related Art

For an electrophotographic image forming apparatus, as the size and weight of a high-voltage power supply for supplying a direct current bias to form an image in a transfer unit decrease, the size and weight of the image forming apparatus decreases. Accordingly, the transformer normally used for the high-voltage power supply, typically an electromagnetic winding transformer, is being replaced with a thin, lightweight high-power piezoelectric transformer. By using a ceramic-based piezoelectric transformer, a high voltage can be more efficiently generated compared with an electromagnetic transformer. In addition, the distance between a primary electrode and secondary electrode can be increased regardless of the coupling between the primary and secondary windings. This can eliminate the need for a special molding process for electrical insulation, thus providing a compact and light-weight high voltage power supply.

An exemplary circuit configuration of a high-voltage power supply with a piezoelectric transformer for outputting positive and negative polarities is now herein described with reference to FIG. 2. FIG. 2 illustrates a circuit of a high-voltage power supply used for attracting means that attracts a transfer medium onto a transport belt by charging the transfer medium in an image forming apparatus. This high-voltage power supply is an example of a high-voltage power supply for outputting positive and negative polarities.

The circuit mainly includes a positive voltage circuit section for generating an output voltage of positive polarity and a negative voltage circuit section for generating an output voltage of negative polarity. Basically, the negative voltage circuit section is similar to the positive voltage circuit section. By reversing a diode polarity of a diode rectifying section of a voltage output stage, the negative voltage circuit section generates a negative voltage.

The positive voltage circuit section includes an off-circuit section 220 in which a comparator 122 compares a voltage divided by resistors 123 and 124 with a positive voltage setting signal $V_{cont\_}+$ so as to switch on and off 24-V power supply to an inductor 112 using a transistor 121. In consideration of a noise effect, the voltage divided by the resistors 123 and 124 is set to about 0.5 V. The supply to the inductor 112 is switched off when the positive voltage setting signal $V_{cont\_}+$ is less than or equal to about 0.5 V. That is, when a negative voltage is output and a negative output detection signal $V_{sns}$ is input to an operational amplifier of the positive voltage circuit section, power supply to a piezoelectric transformer 101 is stopped.

The configuration of the negative voltage circuit section is partially similar to that of the positive voltage circuit section. The similar components in the configuration of the negative voltage circuit section have the same reference numeral with a suffix "'" as those in the configuration of the positive voltage circuit section. Hereinafter, only the positive voltage circuit section is described. The positive voltage circuit section includes the high-voltage piezoelectric transformer (piezoelectric ceramic transformer) 101. The output from the piezoelectric transformer 101 is rectified to a positive voltage and is smoothed by diodes 102 and 103 and a high-voltage capacitor 104. The output is supplied to an attracting roller 500 (see FIG. 3), which is a load of the circuit. In an output voltage detection circuit 206, the output voltage is divided by resistors 105, 106, and 107. The divided voltage is input to a non-inverting input terminal ("+" terminal) of an operational amplifier 109 via a protective resistor 108.

Here, the output voltage detection circuit 206 is configured as shown in FIG. 2 using the resistors 105, 106, and 107 and a capacitor 115 so as to function as a filter circuit. Accordingly, the output voltage detection signal $V_{sns}$ is input to the operational amplifier 109 according to a circuit time constant determined by the part constants of the resistors and capacitors. In contrast, the positive output voltage setting signal $V_{cont\_}+$ of the high-voltage power supply, which is an analog signal from a DC controller 201, is input to an inverting input terminal ("−" terminal) of the operational amplifier 109 via a resistor 114. Here, the operational amplifier 109, the resistor 114, and a capacitor 113 are configured as shown in FIG. 2 so as to function as an integration circuit. The integration circuit has an integration time constant determined by the part constants of the resistors and capacitors. An output terminal of the operational amplifier 109 is connected to a voltage controlled oscillator (VCO) 110. An output terminal of the VCO 110 controls a transistor 111 connected to the inductor 112 so that power is supplied to a primary side of the piezoelectric transformer.

In general, as shown in FIG. 5, a piezoelectric transformer has a mountain-shaped output characteristic with respect to frequency, in which an output voltage becomes maximum at a resonant frequency of $f_0$. Accordingly, by changing a driving frequency, the output voltage can be controlled. For example, by changing the driving frequency from a frequency sufficiently higher than the resonant frequency of $f_0$ to a lower frequency (but still higher than the resonant frequency of $f_0$), the output voltage of the piezoelectric transformer can be increased. Such a high-voltage power supply with a piezoelectric transformer is disclosed in, for example, Japanese Patent Laid-Open No. 11-206113.

When this known example is applied to a high-voltage power supply that requires a positive polarity output and a negative polarity output, the following problems occur.

In general, when the output is supplied to attracting means, a positive polarity output is applied at moments when a transfer medium is passing over the attracting means. In contrast, a negative polarity output that is the same polarity as the toner is applied at moments when there is no sheet passing over the attracting means (i.e., in an intersheet gap) in order to prevent toner from being adhered to the surface of the attracting roller, which is the attracting means, and from contaminating the surface. Therefore, as the state changes from a sheet-passing state to an intersheet gap, and subsequently to a sheet-passing state, the attraction bias output needs to change from positive to negative, and subsequently to positive. For example, in an image forming apparatus having a process speed of about 120 mm/sec, to print about 21 A4-pages per minute, the intersheet gap time is about 400 msec.

An example of a positive/negative output switching control is described next with reference to FIGS. 2 and 7.

In a circuit shown in FIG. 2, the integration circuit constant of an input stage for receiving the positive output voltage setting signal $V_{cont\_}+$ is determined by the 1 MΩ resistor 114 and the 4700 pF capacitor 113. The circuit outputs a positive output voltage of about 1.1 kV DC according to a positive output voltage setting signal $V_{cont\_}+$ of about 5 V. The circuit then changes the output to a negative output voltage of about −500 V DC, and then changes the output to a positive output voltage of about 1.1 kV DC again. The control of this change is described below.

In FIG. 7, the abscissa represents the time and the ordinate represents the voltage. The positive/negative output voltage setting signal $V_{cont}$ is shown in the lower blocks. The output signal is shown in the upper blocks.

Firstly, a positive output voltage setting signal $V_{cont\_}+$ is turned off to turn off the positive output voltage to 0 V. Subsequently, a negative output voltage setting signal $V_{cont\_}-$ is turned on so as to apply a negative pre-bias voltage for about 300 msec. A negative target voltage of −500 V is then output. Thereafter, to switch the negative output to a positive output, the negative output voltage setting signal $V_{cont\_}-$ is turned off so as to turn off the negative output voltage to 0 V. Subsequently, the positive output voltage setting signal $V_{cont\_}+$ is turned on so as to apply a positive pre-bias voltage for about 300 msec. A positive target voltage of +1.1 kV is then output. Thus, in a known switching control, as shown in FIG. 7, a control is performed as follows: outputting a positive voltage, turning off the positive output, outputting 0 V, applying a negative pre-bias, outputting a negative voltage, turning off the negative output, outputting 0 V, applying a positive pre-bias, and outputting a positive voltage. That is, the output is turned off so that the output once becomes 0 V. A pre-bias voltage is then applied to raise the next output voltage. To perform this control, the pre-bias is applied for about 300 msec so that a switching time of about 1000 msec is required. This relatively long switching time does not allow the switching to be completed within the intersheet gap time.

SUMMARY OF THE INVENTION

According to a first aspect of the present invention there is provided a power supply. According to a second aspect of the invention there is provided an image forming apparatus.

The present invention provides a high-voltage power supply with a piezoelectric transformer capable of switching a positive output voltage to a negative output voltage and vice versa in a short time and provides an image forming apparatus using the same.

According to an embodiment of the present invention, a high-voltage power supply with a piezoelectric transformer includes a positive output voltage generation circuit and a negative output voltage generation circuit. Each of the positive output voltage generation circuit and the negative output voltage generation circuit includes a piezoelectric transformer, a piezoelectric transformer driving circuit, an output voltage detection circuit, and a drive control circuit for outputting a control signal for controlling the piezoelectric transformer driving circuit on the basis of a signal from the output voltage detection circuit and an output voltage setting signal for setting an output voltage. The positive output voltage generation circuit and the negative output voltage generation circuit are simultaneously turned on when the output polarity of the high-voltage power supply with a piezoelectric transformer is switched. According to the embodiment of the present invention, an image forming apparatus using the high-voltage power supply with a piezoelectric transformer can be provided which is capable of switching the polarity of output voltage in a short time and in a simple manner.

The image forming apparatus can change the period of time when the positive output voltage generation circuit and the negative output voltage generation circuit are simultaneously turned on depending on the value of the target output voltage. Thus, the polarity of the output voltage can be changed in a short time regardless of the output voltage value of the high-voltage power supply with a piezoelectric transformer.

Additionally, the image forming apparatus can change the period of time when the positive output voltage generation circuit and the negative output voltage generation circuit are simultaneously turned on depending on the temperature or humidity of the operating environment of the image forming apparatus. Thus, the polarity of output voltage can be changed in a short time regardless of the temperature or humidity of the operating environment of the image forming apparatus.

Further features of the present invention will become apparent from the following description of exemplary embodiments with reference to the attached drawings.

DESCRIPTION OF THE EMBODIMENTS

Exemplary embodiments of the present invention are described in detail below with reference to the accompanying drawings.

First Exemplary Embodiment

A first exemplary embodiment of the present invention is described next.

Figure 3:
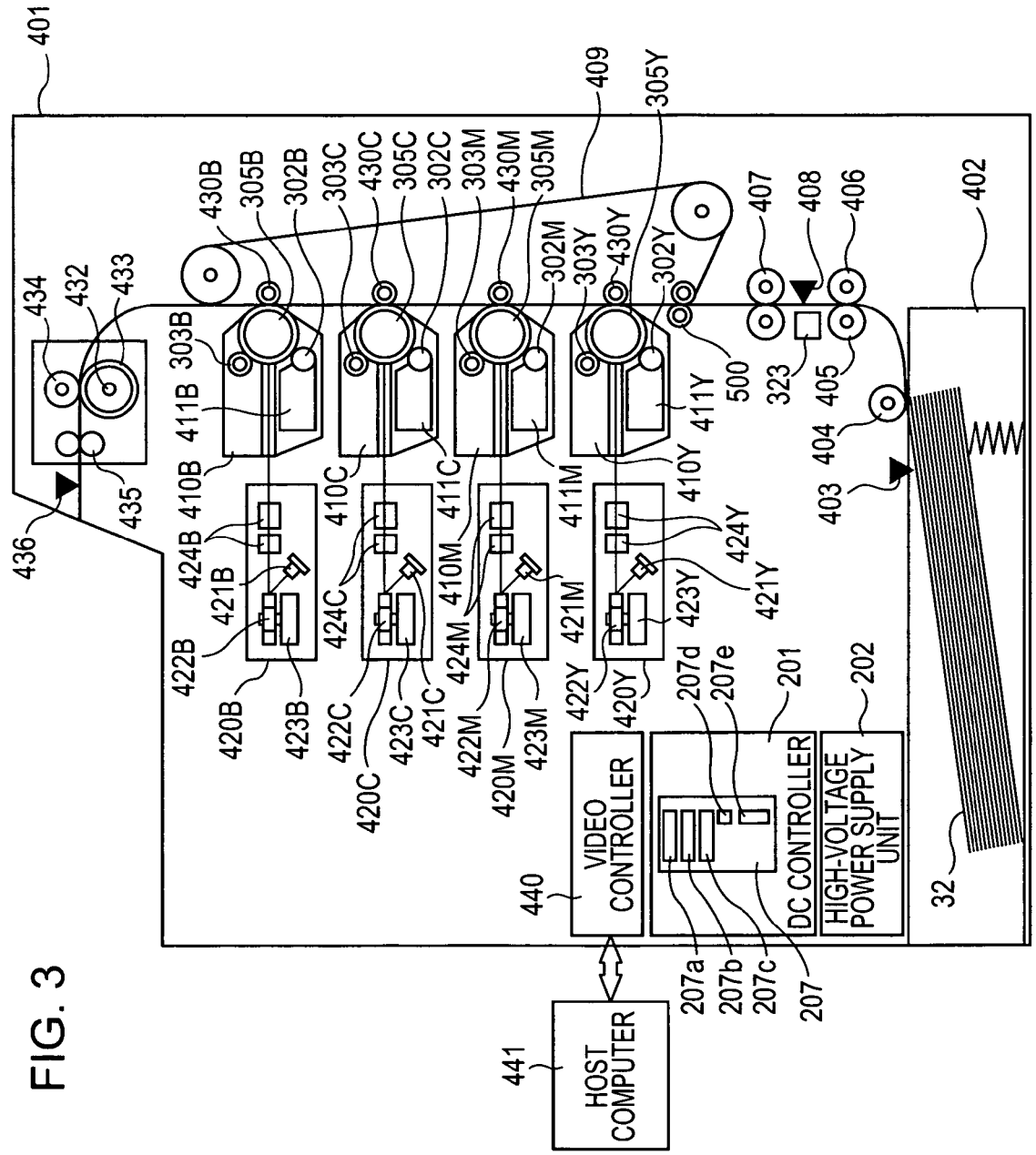
FIG. 3 is a block diagram of a color laser printer according to the first embodiment.

FIG. 3 is a block diagram of a color laser printer, which is an example of an image forming apparatus according to this embodiment. A laser printer 401 includes a deck 402 for storing a recording paper sheet 32 (transfer medium), a deck paper presence detection sensor 403 for detecting the presence of the recording paper sheet 32 in the deck 402, a pickup roller 404 for picking up the recording paper sheet 32 from the deck 402, a deck feed roller 405 for feeding the recording paper sheet 32 picked up by the pickup roller 404, and a retard roller 406 for preventing double feeding of the recording paper sheet 32 in cooperation with the deck feed roller 405.

The laser printer 401 further includes a pair of registration rollers 407 for synchronously feeding the recording paper sheet 32 and a pre-registration sensor 408 for detecting a transport state of the recording paper sheet 32, both of which are disposed downstream of the deck feed roller 405. An electrostatic attracting transport transfer belt (hereinafter referred to as an "ETB") 409 is disposed downstream of the pair of registration rollers 407. On the ETB 409, an attracting roller 500 serving as attracting means is disposed for charging the recording paper sheet 32 to attract the recording paper sheet (transfer medium) 32 onto the ETB 409. On the ETB 409, images formed by an image forming unit including process cartridges 410Y, 410M, 410C, and 410B for four colors (yellow Y, magenta M, cyan C, and black B, respectively) and scanner units 420Y, 420M, 420C, and 420B are sequentially interposed one on top of the other to form a color image, which is transferred onto the recording paper sheet 32 and is transported. It is noted that, in the following description, which is common for the four colors, suffixes "Y", "M", "C", and "B" of reference numerals are removed (for example, process cartridge 410).

Downstream of the ETB 409 are disposed a fuser unit for fixing a toner image transferred onto the recording paper sheet 32, which includes a fusing sleeve 433 as a fusing member with a heater 432 in it, a pressure roller 434 serving as pressuring means and a pair of fusing output rollers 435 for feeding the recording paper sheet 32 from the fusing sleeve 433, and are disposed a fusing output sensor 436 for detecting the feed state from the fuser unit. Each scanner unit 420 includes a laser unit 421 for emitting a laser beam modulated by an image signal transmitted from a video controller 440, a polygon mirror 422 for causing the laser beam to scan a photosensitive drum 305, a scanner motor 423, and a focusing lens group 424.

Each process cartridge 410 includes the photosensitive drum 305, a charger roller 303, a developing roller 302, and a toner container 411, which are well known for an electrophotographic process. The process cartridge 410 is removably attached to the laser printer 401. Upon receiving image data transmitted from an external apparatus 441 including a personal computer, the video controller 440 expands the image data into bitmap data so as to generate image signals for image formation. To control the laser printer 401, a DC controller 201 includes a microcomputer (MPU) 207 having a random access memory (RAM) 207a, a read only memory (ROM) 207b, a timer 207c, a digital input/output port 207d, a digital to analog (D/A) port 207e, and an analog to digital (A/D) port, and a variety of input/output control circuits (not shown).

A high-voltage power supply unit 202 includes a charging high-voltage power supply (not shown) corresponding to each process cartridge, a developing high-voltage power supply (not shown), a transfer high-voltage power supply (not shown) capable of outputting a high voltage corresponding to each transfer roller 430, and an attracting high voltage power supply for the attracting means.

In this embodiment, as an example of a high-voltage power supply for switching the polarities of positive and negative output and as an example of a high-voltage power supply for the attracting means, a high-voltage power supply with a piezoelectric transformer is employed.

Figure 4:
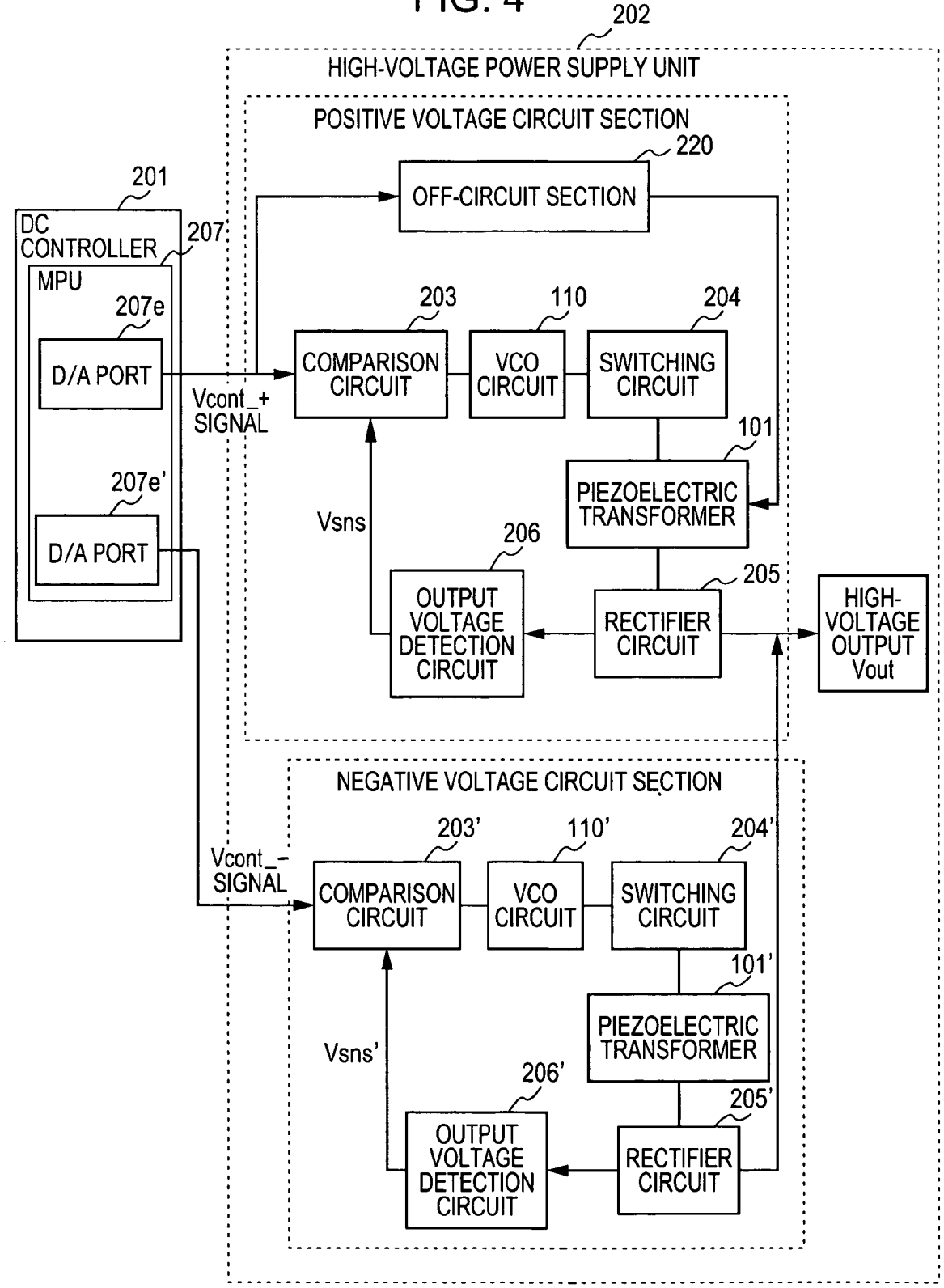
FIG. 4 is a block diagram of the high-voltage power supply with a piezoelectric transformer according to the first embodiment.

The configuration of the high-voltage power supply with a piezoelectric transformer according to this embodiment is described next with reference to a block diagram shown in FIG. 4. The configuration according to this embodiment comprises a positive voltage circuit section and a negative voltage circuit section.

The positive voltage circuit section and the negative voltage circuit section have similar circuit components, and therefore, only the positive voltage circuit section is described below.

A positive voltage setting signal $V_{cont\_}+$ is output from the D/A port 207e of the MPU 207 incorporated in the DC controller 201 serving as a control unit. The positive voltage setting signal $V_{cont\_}+$ is input to an integration circuit (comparison circuit) 203 including an operational amplifier. Similarly, a negative voltage setting signal $V_{cont\_}-$ is output from a D/A port 207e' of the MPU 207. The negative voltage setting signal $V_{cont\_}-$ is input to an integration circuit (comparison circuit) 203' including an operational amplifier.

The output from the integration circuit (comparison circuit) 203 is converted to a frequency via a voltage-controlled oscillator (VCO) circuit 110. The converted frequency controls a switching circuit 204 so that the piezoelectric transformer (piezoelectric ceramic transformer) 101 operates to output a voltage in accordance with the frequency characteristic and voltage rising ratio of the piezoelectric transformer 101. For example, as shown in FIG. 4, the output from the transformer is rectified and smoothed to a positive voltage by a rectifier circuit 205. A high-voltage output $V_{out}$ is supplied to a load (e.g., attracting roller 500). At the same time, the rectified voltage is fed back to the comparison circuit 203 via the output voltage detection circuit 206. The comparison circuit 203 controls the output thereof so that the polarity of an output voltage detection signal $V_{sns}$ is the same as that of the negative voltage setting signal $V_{cont\_}-$.

Figure 2:
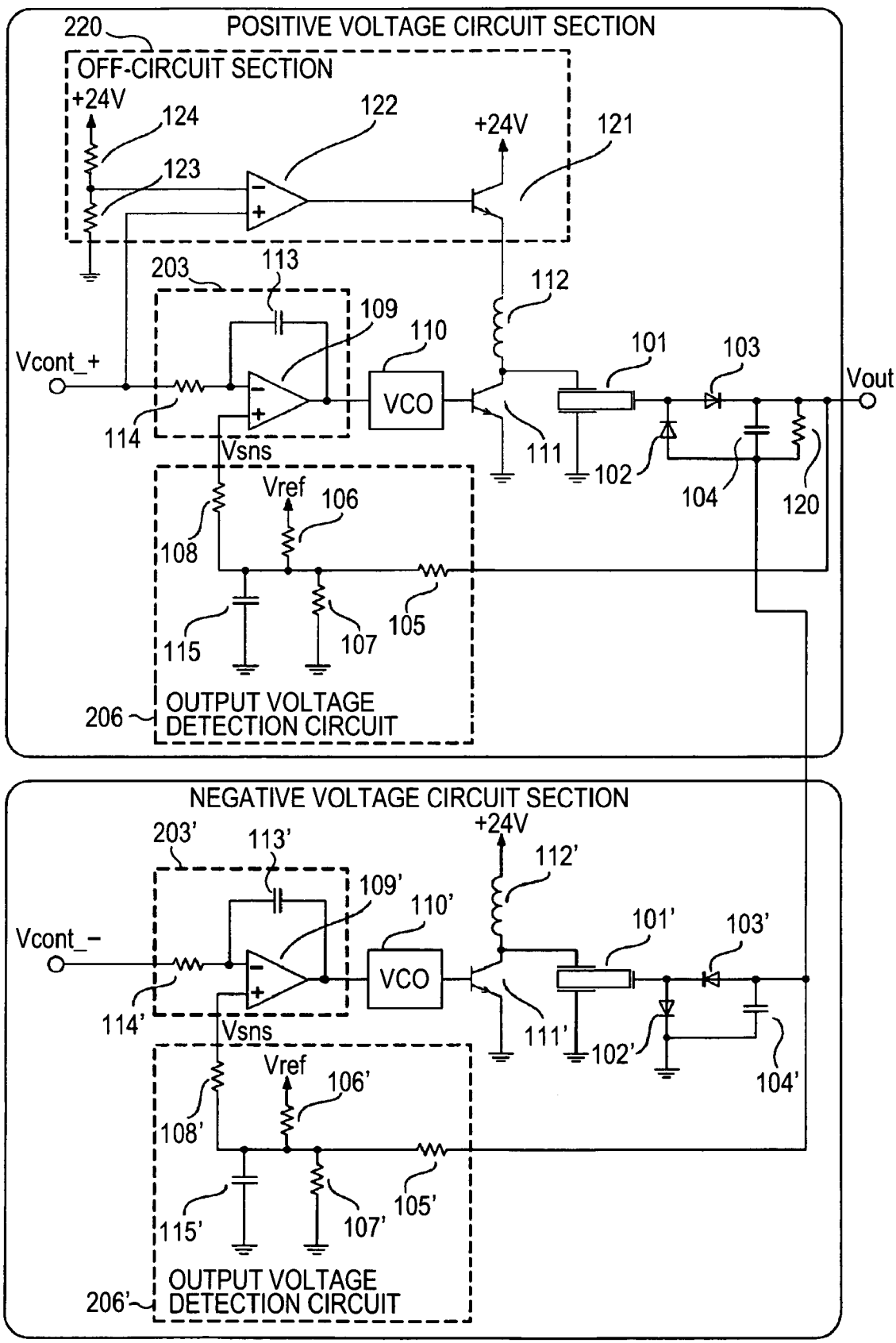
FIG. 2 illustrates an example of a circuit diagram of a known high-voltage power supply with a piezoelectric transformer.

The high-voltage power supply with a piezoelectric transformer is described next with reference to FIG. 2. A positive voltage setting signal $V_{cont\_}+$ for a high-voltage power supply is input from the DC controller 201 (FIG. 4) to an inverting input terminal ("−" terminal) of the operational amplifier 109 via a series resistor 114 and a capacitor 113. In contrast, in the output voltage detection circuit 206, the output voltage $V_{out}$ is divided by resistors 105, 106, and 107. The divided voltage output is output to a non-inverting input terminal ("+" terminal) of the operational amplifier 109 via a capacitor 115 and the protective resistor 108 as an output voltage detection signal $V_{sns}$. An output terminal of the operational amplifier 109 is connected to the voltage-controlled oscillator (VCO) circuit 110. An output terminal of the voltage-controlled oscillator (VCO) circuit 110 is connected to a base of a transistor 111. A collector of the transistor 111 is connected to a power supply (+24 V) via an inductor 112 and is also connected to one of two electrodes of a primary side of the piezoelectric transformer 101. The output of the piezoelectric transformer 101 is rectified and smoothed to a positive voltage by diodes 102 and 103 and a high-voltage capacitor 104. The output is then supplied to the attracting roller 500, which is a load.

Figure 5:
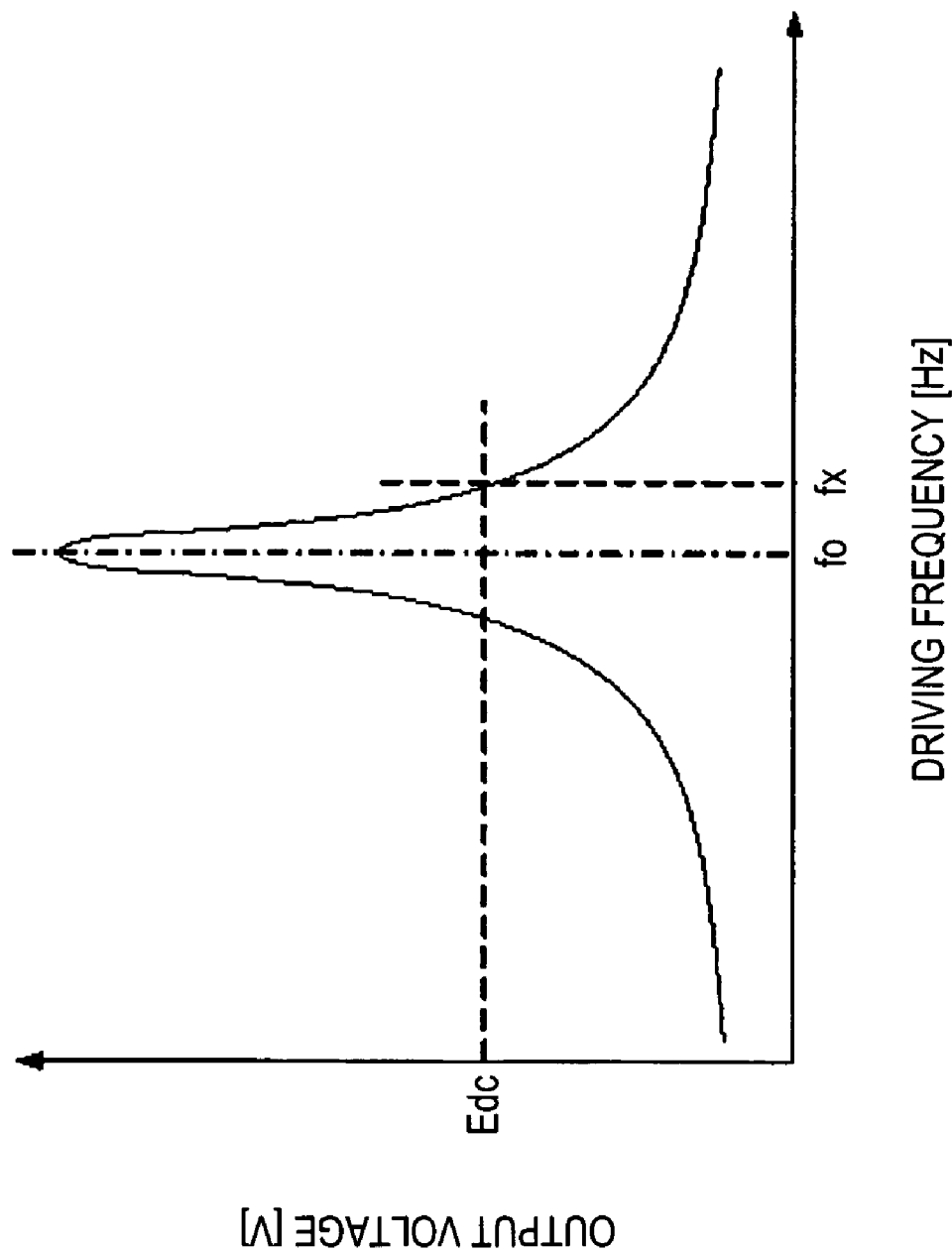
FIG. 5 illustrates an output voltage characteristic of a piezoelectric transformer with respect to a driving frequency.

FIG. 5 illustrates an output voltage characteristic of the piezoelectric transformer 101 with respect to a driving frequency. As can be seen from FIG. 5, an output voltage becomes maximum at a resonant frequency of $f_0$ so that the output voltage can be controlled by the frequency. In FIG. 5, a stipulated output voltage Edc is output at a driving frequency of $f_x$. As the input voltage increases, the voltage-controlled oscillator (VCO) circuit 110 increases the output frequency. Also, as the input voltage decreases, the voltage-controlled oscillator (VCO) circuit 110 decreases the output frequency. Under this condition, if the output voltage $V_{out}$ becomes slightly higher than a voltage corresponding to the stipulated output voltage Edc, the input voltage $V_{sns}$ applied to the non-inverting input terminal ("+" terminal) of the operational amplifier 109 increases via a resistor 105, and therefore, the output voltage of the operational amplifier 109 increases. In other words, since the input voltage applied to the voltage-controlled oscillator (VCO) circuit 110 increases, the driving frequency of the piezoelectric transformer 101 increases. Accordingly, the piezoelectric transformer 101 is driven by a frequency slightly higher than the driving frequency $f_x$. The increased driving frequency decreases the output voltage of the piezoelectric transformer 101. As a result, the control is performed so that the output voltage $V_{out}$ decreases. That is, this circuit serves as a negative feedback control circuit.

In contrast, if the output voltage $V_{out}$ becomes slightly lower than the stipulated output voltage Edc, the input voltage $V_{sns}$ applied to the operational amplifier 109 decreases, and therefore, the output voltage of the operational amplifier 109 decreases. In other words, since the output frequency of the voltage-controlled oscillator (VCO) circuit 110 decreases, the piezoelectric transformer 101 is driven so that the piezoelectric transformer 101 increases the output voltage $V_{out}$. Thus, the constant output voltage control is performed so that the output voltage is identical to the voltage Edc determined by the voltage of the output voltage setting signal $V_{cont}$ (setting voltage: hereinafter this setting voltage is also referred to as "$V_{cont}$") from the DC controller 201 input to the inverting input terminal ("−" terminal) of the operational amplifier 109.

A circuit is next described that processes the output voltage setting signal $V_{cont}$, which is input from the DC controller 201 to the inverting input terminal ("−" terminal) of the operational amplifier 109, and the output voltage detection signal $V_{sns}$, which is input to the non-inverting input terminal ("+" terminal) of the operational amplifier 109 after detecting an output voltage. The operational amplifier 109, the resistor 114, and the capacitor 113 are configured as shown in FIG. 2 so as to serve as an integration circuit. A signal varying with respect to the output voltage setting signal $V_{cont}$ depending on a time constant $T_{cont}$ determined by part constants of the resistor 114 and the capacitor 113 is input to the operational amplifier 109.

As the resistance value of the resistor 114 increases, the time constant $T_{cont}$ increases. Similarly, as the capacitance of the capacitor 113 increases, the time constant $T_{cont}$ increases. Additionally, the resistors 105, 106, and 107 and the capacitor 115 form a filter circuit. The output voltage detection signal $V_{sns}$ varying depending on a time constant $T_{sns}$ determined by part constants of the resistors 105, 106, and 107 and the capacitor 115 is input to the operational amplifier 109. Here, the part constants of the resistor 114 and the capacitor 113 and the part constants of the resistors 105, 106, and 107 and the capacitor 115 are determined so that the following conditions are satisfied: $T_{cont} > T_{sns}$, $T_{cont} = R114 \times C113$, and $T_{sns} = R_s \times C115$, where R105, R106, R107 and R114 represent the resistances of the resistors 105, 106, 107, and 114, respectively, C113 and C115 represent the capacitances of the capacitors 113 and 115, respectively, and $R_s$ is a combined resistance of R105, R106, and R107. Thus, the circuit can be controlled while preventing oscillation. That is, since the time constant $T_{sns}$ is smaller than the time constant $T_{cont}$ and the output voltage detection signal $V_{sns}$ rises more rapidly than the output voltage setting signal $V_{cont}$, the feedback control can be normally performed without oscillation.

The positive/negative polarity switching control of the output voltage is described below, in which such a circuit according to the first embodiment is employed for a high-voltage power supply with a piezoelectric transformer.

The switching control is described next with reference to FIG. 1.

Figure 1:
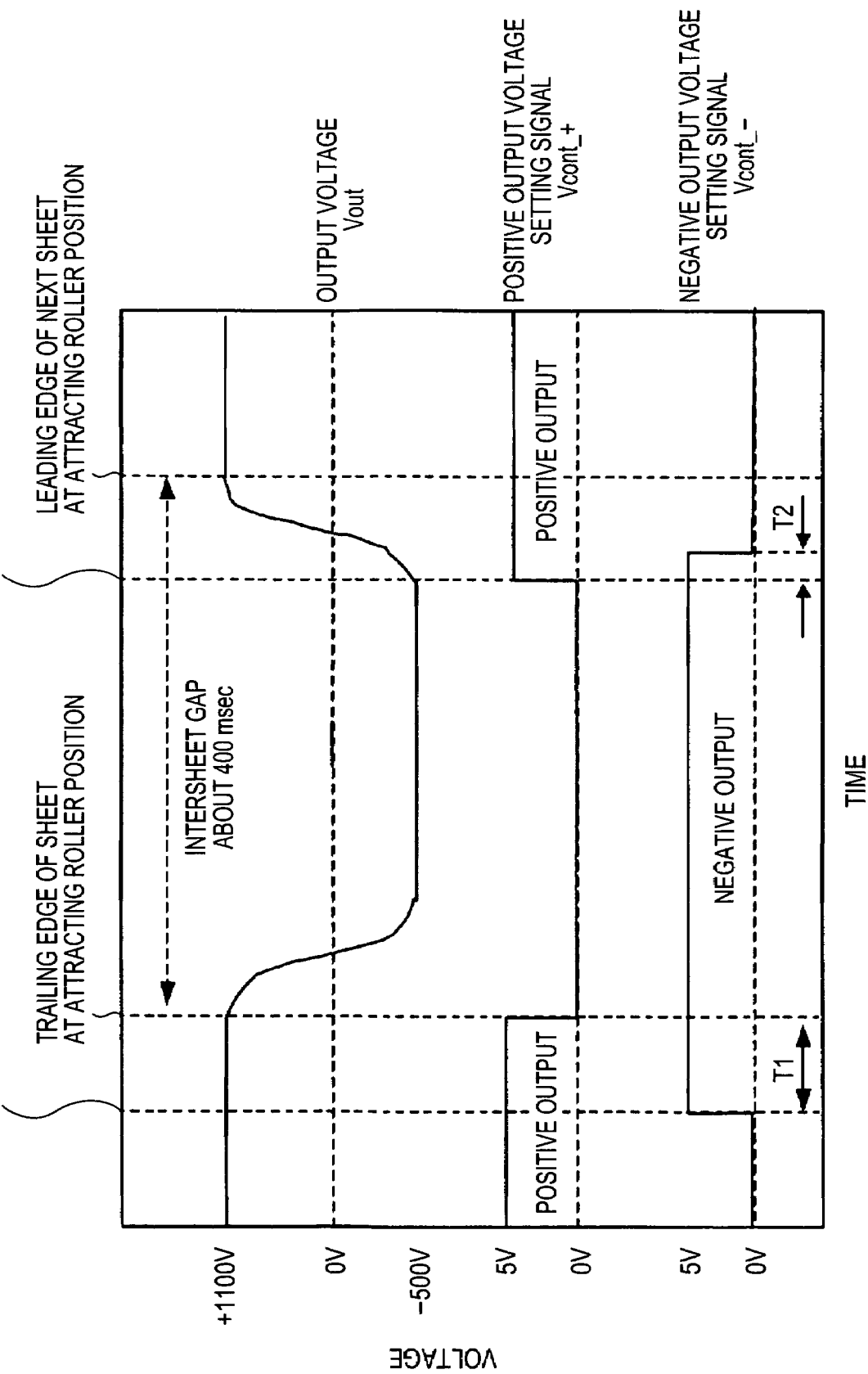
FIG. 1 illustrates the output control of a high-voltage power supply with a piezoelectric transformer according to a first embodiment of the present invention.

In FIG. 1, the abscissa represents the time and the ordinate represents the voltage. The positive output voltage setting signal $V_{cont\_}+$ and the negative output voltage setting signal $V_{cont\_}-$ is shown in the lower blocks. The output signal $V_{out}$ is shown in the upper blocks.

An image forming apparatus according to this embodiment has a process speed of about 120 mm/sec to print about 21 A4-pages per minute. During continuous printing, the intersheet gap time is about 400 msec. The pre-registration sensor 408 detects the timing of the movement of a sheet. It takes about 120 msec for the sheet to move from the position of the pre-registration sensor 408 (FIG. 3) to the position of an attracting roller, which is the attracting means. The positive/negative polarity switching control of the attracting bias output in the intersheet gap time is now herein described.

In this embodiment, the positive voltage of the attracting bias is about 1.1 kV whereas the negative voltage of the attracting bias is about −500 V.

This embodiment is characterized in that positive output voltage setting means and negative output voltage setting means are simultaneously turned on for a certain period of time.

In the positive to negative voltage control, when the pre-registration sensor 408 detects the trailing edge of a transfer medium while outputting the positive output voltage setting signal $V_{cont\_}+$, the negative output voltage setting signal $V_{cont\_}-$ is output. When the trailing edge of the transfer medium reaches the position of the attracting roller, the positive output voltage setting signal $V_{cont\_}+$ is turned off.

According to the first embodiment, a period of time T1 when the positive output voltage setting means and the negative output voltage setting means are simultaneously turned on is determined to be about 120 msec.

In the negative to positive voltage control, when the pre-registration sensor 408 detects the leading edge of the next transfer medium, the positive output voltage setting signal $V_{cont\_}+$ is turned on, and the negative output voltage setting signal $V_{cont\_}-$ is turned off after a period of time T2 when the positive output voltage setting means and the negative output voltage setting means are simultaneously turned on has elapsed. According to the first embodiment, the period of time T2 when the positive output voltage setting means and the negative output voltage setting means are simultaneously turned on is determined to be about 50 msec.

Figure 6:
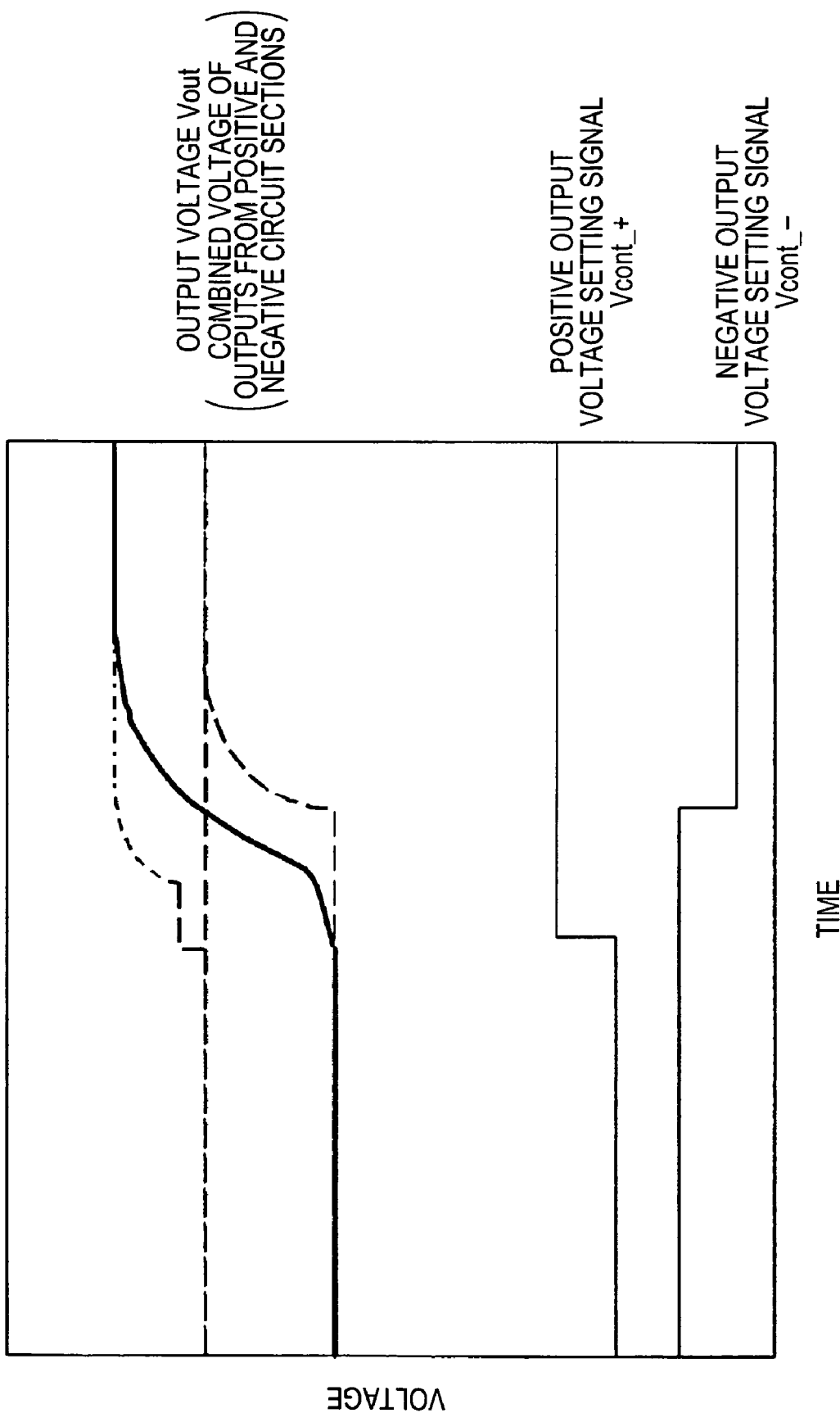
FIG. 6 illustrates a switching from a negative output voltage to a positive output voltage according to the first embodiment of the present invention.
Figure 7:
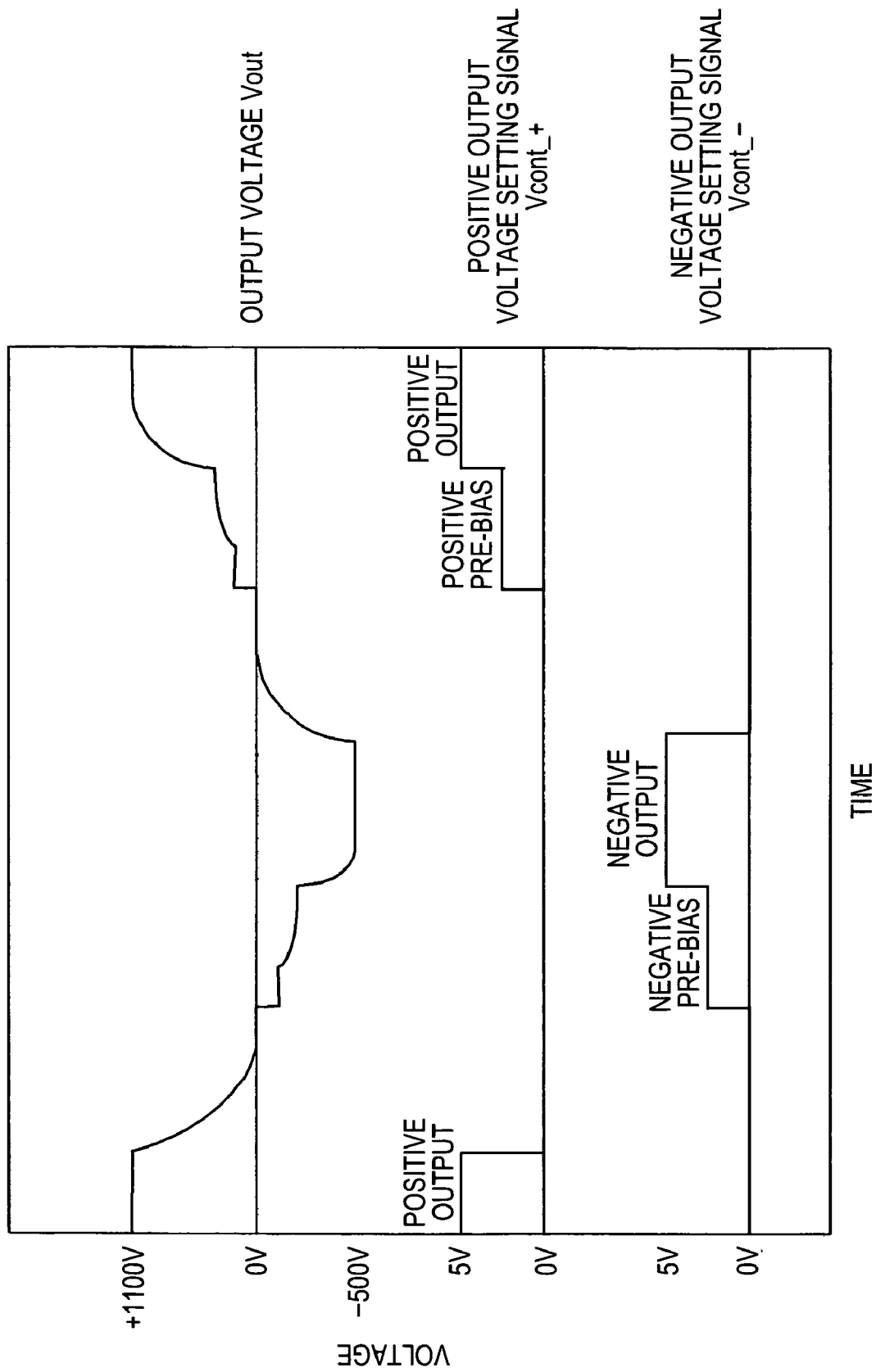
FIG. 7 illustrates the output control of a known high-voltage power supply with a piezoelectric transformer.

In this case, as shown in FIG. 6, the output from the positive circuit section is combined with the output from the negative circuit section to generate an output voltage $V_{out}$. Accordingly, in consideration of the rising time of the positive output voltage from the positive circuit section, the positive output voltage setting signal $V_{cont\_}+$ is turned on at a time when the leading edge of the transfer medium reaches the pre-registration sensor, which is a time earlier than the time when the leading edge of the transfer medium reaches the position of the attracting roller. In consideration of the falling voltage curve when the negative output voltage setting signal $V_{cont\_}-$ is turned off, the period of time T2 when the positive output voltage setting means and the negative output voltage setting means are simultaneously turned on is determined so that the combined output $V_{out}$ becomes the target positive output voltage when the leading edge of the transfer medium reaches the position of the attracting roller. In this embodiment, the negative to positive output switching time is about 120 msec.

As described above, according to the first embodiment of the present invention, an image forming apparatus includes a high-voltage power supply with a piezoelectric transformer. The high-voltage power supply includes positive output voltage setting means and negative output voltage setting means composed of a piezoelectric transformer, means for generating a driving frequency of the piezoelectric transformer, output voltage setting means, output voltage detection means, and output control means for controlling an output voltage by comparing a signal from the output voltage detection means with an output voltage setting signal. When the high-voltage power supply with a piezoelectric transformer switches the polarity of the output, the positive output voltage setting means and the negative output voltage setting means are simultaneously turned on for a certain period of time. Thus, the output polarity switching time can be decreased, and therefore, the switching can be completed within an intersheet gap time during continuous printing.

While the first exemplary embodiment of the present invention has been described with reference to a high-voltage power supply for attracting means, a power supply according to the present invention is also applicable as a high-voltage power supply for other means, such as transfer means, with the same advantages when negative/positive polarity switching is performed.

Additionally, while the first exemplary embodiment of the present invention has been described with reference to a tandem color image forming apparatus, the first embodiment is also applicable to an image forming apparatus of any method using a high-voltage bias.

Second Exemplary Embodiment

A second exemplary embodiment of the present invention is described below. Here, descriptions of the components described in the first embodiment are not repeated.

In the second exemplary embodiment, a period of time when the positive output voltage setting means and the negative output voltage setting means are simultaneously turned on is changed depending on the operating environment of an image forming apparatus, namely, the target value of attracting bias voltage.

In general, the optimum attracting bias target voltage varies depending on the operating environment of the image forming apparatus. TABLE-1 illustrates an example of attracting bias target values when the environment is changed.

Examples of T1 and T2 which are respectively periods of time when positive output voltage setting means and the negative output voltage setting means are simultaneously turned on depending on operating environment and target voltage

TABLE 1

| | Environment | | Attracting bias target | | Period of time when positive and negative voltages are on | |
|---|---|---|---|---|---|---|
| | Temperature | Humidity | Positive Voltage | Negative Voltage | T1 | T2 |
| L/L | 15° C. | 10% RH | +1.6 kV | −500 V | 120 msec | 0 msec |
| N/N | 23° C. | 50% RH | +1.1 kV | −500 V | 120 msec | 50 msec |
| H/H | 30° C. | 80% RH | +500 V | −500 V | 120 msec | 100 msec |

In a low-temperature and low-humidity environment (hereinafter referred to as "L/L") in which the temperature is 15° C. and the humidity is 10% RH, the resistance value of a transfer medium becomes high and the attracting bias target value becomes a high value of about +1.6 kV. In contrast, in a high-temperature and high-humidity environment (hereinafter referred to as "H/H") in which the temperature is 30° C. and the humidity is 80% RH, the attracting bias target value becomes a low value of about +500 V.

Accordingly, since the rising time varies depending on the attracting bias target voltage, a period of time when the positive output voltage setting means and the negative output voltage setting means are simultaneously turned on is changed.

In this embodiment, during L/L, a target voltage is +1.6 kV and the time T2 is 0 msec. During H/H, a target voltage is +500 V. Therefore, the time T2 is set to 100 msec.

In this embodiment, the time T1 is constant. However, the time T1 may be changed to an optimum value depending on an environment and a target voltage.

Since the time T2 has an impact on the attractivity of the leading edge of the transfer medium, the time T2 is changed to an optimum value depending on an environment and a target voltage. However, even when the time T1 is slightly changed, the effect of the contamination prevention in an intersheet gap time is substantially the same. Accordingly, the time T1 can optionally be determined to be constant so that the control flow remains simple.

As described above, according to the second embodiment of the present invention, by changing a period of time when the positive output voltage setting means and the negative output voltage setting means are simultaneously turned on depending on the operating environment of an image forming apparatus, namely, the target value of attracting bias voltage, the output polarity switching time can be decreased, and therefore, the switching can be optimized.

While the second exemplary embodiment of the present invention has been described with reference to a high-voltage power supply for attracting means, the power supply is also applicable as a high-voltage power supply for other means, such as transfer means, with the same advantages when negative/positive polarity switching is performed.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Application No. 2005-222761 filed Aug. 1, 2005, which is hereby incorporated by reference herein in its entirety.

What is claimed is:

1. A power supply having a switchable polarity, the power supply comprising:
   a positive output voltage generation circuit; and
   a negative output voltage generation circuit;
   wherein each of the positive output voltage generation circuit and the negative output voltage generation circuit includes a piezoelectric transformer, a piezoelectric transformer driving circuit, an output voltage detection circuit, and a drive control circuit for outputting a control signal for controlling the piezoelectric transformer driving circuit using a signal from the output voltage detection circuit and an output voltage setting signal for setting an output voltage, and
   wherein the drive control circuit sets a period that the positive output voltage generation circuit and the negative output voltage generation circuit output a voltage at a same time in the case that the output polarity of the power supply is switched.

2. An image forming apparatus comprising:
   a belt member for transporting a transfer medium while electrostatically attracting the transfer medium;
   an attracting unit for charging the transfer medium so as to electrostatically attract the transfer medium onto the belt member; and
   a power supply for applying a high voltage to the attracting unit, the power supply having a switchable polarity, the power supply including,
      a positive output voltage generation circuit; and
      a negative output voltage generation circuit;

wherein each of the positive output voltage generation circuit and the negative output voltage generation circuit includes a piezoelectric transformer, a piezoelectric transformer driving circuit, an output voltage detection circuit, and a drive control circuit for outputting a control signal for controlling the piezoelectric transformer driving circuit using a signal from the output voltage detection circuit and an output voltage setting signal for setting an output voltage, and wherein the drive control circuit sets a period that the positive output voltage generation circuit and the negative output voltage generation circuit output a voltage at a same time in the case that the output polarity of the power supply is switched.

3. An image forming apparatus as claimed in claim 2, wherein, in the case that the output polarity of the power supply is switched, the power supply sets the period of time depending on the temperature or humidity of the operating environment of the image forming apparatus.

4. An image forming apparatus as claimed in claim 2, wherein, in the case that the output polarity of the power supply is switched, the period of time when the positive output voltage generation circuit and the negative output voltage generation circuit are both energized is changed depending on a value of target voltage applied to the attracting unit.

5. An image forming apparatus comprising:

a belt member for transporting a transfer medium while electrostatically attracting the transfer medium;

an attracting unit for charging the transfer medium so as to electrostatically attract the transfer medium onto the belt member; and a power supply for applying a high voltage to the attracting unit, the power supply having a switchable polarity, the power supply including, a positive output voltage generation circuit; and a negative output voltage generation circuit;

wherein each of the positive output voltage generation circuit and the negative output voltage generation circuit includes a piezoelectric transformer, a piezoelectric transformer driving circuit, an output voltage detection circuit, and a drive control circuit for outputting a control signal for controlling the piezoelectric transformer driving circuit using a signal from the output voltage detection circuit and an output voltage setting signal for setting an output voltage, and wherein the positive output voltage generation circuit and the negative output voltage generation circuit are both energized in the case that the output polarity of the power supply is switched, wherein, in the case that the output polarity of the power supply is switched, the period of time when the positive output voltage generation circuit and the negative output voltage generation circuit are both energized depending on the temperature or humidity of the operating environment of the image forming apparatus.

* * * * *